(12) United States Patent
Bergman et al.

(10) Patent No.: US 10,881,001 B2
(45) Date of Patent: Dec. 29, 2020

(54) MICRO CONDUCTIVE THREAD INTERCONNECT COMPONENT TO MAKE AN INTERCONNECT BETWEEN CONDUCTIVE THREADS IN FABRICS TO PCB, FPC, AND RIGID-FLEX CIRCUITS

(71) Applicant: Flex Ltd., Singapore (SG)

(72) Inventors: Mark Bergman, Redwood City, CA (US); Yolita Nugent, Chestnut Hill, MA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/910,740

(22) Filed: Mar. 2, 2018

(65) Prior Publication Data

US 2018/0255639 A1     Sep. 6, 2018

Related U.S. Application Data

(60) Provisional application No. 62/466,270, filed on Mar. 2, 2017.

(51) Int. Cl.

| | |
|---|---|
| *H05K 1/00* | (2006.01) |
| *H05K 1/02* | (2006.01) |
| *H05K 1/14* | (2006.01) |
| *H05K 3/00* | (2006.01) |
| *H05K 3/10* | (2006.01) |
| *H01L 21/28* | (2006.01) |
| *H01L 23/28* | (2006.01) |
| *H01L 23/31* | (2006.01) |
| *H01L 23/52* | (2006.01) |

(Continued)

(52) U.S. Cl.
CPC .......... *H05K 1/118* (2013.01); *D03D 1/0082* (2013.01); *H05K 1/038* (2013.01); *H05K 1/0393* (2013.01); *H05K 1/119* (2013.01); *H05K 1/189* (2013.01); *H05K 3/36* (2013.01); *A41D 1/005* (2013.01); *H01R 4/00* (2013.01); *H05K 3/103* (2013.01); *H05K 3/12* (2013.01)

(58) Field of Classification Search
CPC .. H05K 1/00; H05K 1/02; H05K 1/14; H05K 3/00; H05K 3/10; H01L 21/28; H01L 23/28; H01L 23/31; H01L 23/52
USPC .......... 174/261, 254; 257/379, 723; 361/749
See application file for complete search history.

(56) References Cited

U.S. PATENT DOCUMENTS

| | | | |
|---|---|---|---|
| 4,492,949 A | 1/1985 | Peterson | |
| 4,774,530 A * | 9/1988 | Hawkins | ................ B41J 2/1404 156/147 |

(Continued)

FOREIGN PATENT DOCUMENTS

JP      2013187380 A      9/2013

OTHER PUBLICATIONS

Non final office action dated Apr. 1, 2019. U.S. Appl No. 15/995,965, filed Jun. 1, 2018, Applicant: Weifeng Liu, 29 pages.

(Continued)

*Primary Examiner* — Xiaoliang Chen
(74) *Attorney, Agent, or Firm* — Haverstock & Owens LLP

(57) ABSTRACT

An interconnect component is configured as an adapter or interposer providing mechanical and electrical interconnects between conductive threads, such as those woven within fabrics, and electrical connection points, such as contact pads on a printed circuit board (PCB), a flexible printed circuit (FPC), and/or a rigid-flex circuit board.

29 Claims, 4 Drawing Sheets

(51) Int. Cl.
*H05K 1/11* (2006.01)
*H05K 1/18* (2006.01)
*H05K 1/03* (2006.01)
*D03D 1/00* (2006.01)
*H05K 3/36* (2006.01)
*A41D 1/00* (2018.01)
*H01R 4/00* (2006.01)
*H05K 3/12* (2006.01)

(56) References Cited

U.S. PATENT DOCUMENTS

| | | | |
|---|---|---|---|
| 4,855,537 A | 8/1989 | Nakai et al. | |
| 5,291,374 A * | 3/1994 | Hirata | H01L 23/532 174/255 |
| 5,479,138 A | 12/1995 | Kuroda et al. | |
| 5,626,135 A | 5/1997 | Sanfilippo | |
| 5,675,299 A | 11/1997 | Suski | |
| 5,739,254 A * | 4/1998 | Fuller | C08F 8/24 347/65 |
| 5,761,809 A * | 6/1998 | Fuller | B41J 2/1604 29/890.1 |
| 5,762,812 A * | 6/1998 | Narang | B41J 2/14129 156/234 |
| 5,849,809 A * | 12/1998 | Narang | B41J 2/1603 522/35 |
| 5,863,963 A * | 1/1999 | Narang | C08F 283/00 347/20 |
| 5,945,253 A * | 8/1999 | Narang | B41J 2/14129 430/280.1 |
| 5,958,995 A * | 9/1999 | Narang | B41J 2/1604 347/220 |
| 5,994,425 A * | 11/1999 | Narang | B41J 2/1604 106/31.78 |
| 6,007,877 A * | 12/1999 | Narang | B41J 2/1603 347/20 |
| 6,124,372 A * | 9/2000 | Smith | B41J 2/14032 347/20 |
| 6,139,920 A * | 10/2000 | Smith | C08L 63/00 427/510 |
| 6,260,956 B1 * | 7/2001 | Narang | B41J 2/1604 156/145 |
| 6,302,523 B1 * | 10/2001 | Smith | B41J 2/16 347/45 |
| 6,370,034 B1 | 4/2002 | Busch | |
| 6,534,723 B1 | 3/2003 | Asai | |
| 6,964,205 B2 | 11/2005 | Papakostas | |
| 7,072,721 B1 | 7/2006 | Trent | |
| 7,456,571 B1 | 11/2008 | Wedding | |
| 7,504,904 B1 | 3/2009 | Powers et al. | |
| 7,578,195 B2 | 8/2009 | DeAngelis | |
| 8,587,385 B2 | 11/2013 | Umeda | |
| 8,987,707 B2 | 3/2015 | Arnold | |
| 9,706,647 B2 | 7/2017 | Hsu | |
| 9,736,930 B2 | 8/2017 | Yang | |
| 9,788,789 B2 | 10/2017 | Bailey | |
| 9,832,863 B2 | 11/2017 | Elsherbini | |
| 9,842,269 B2 | 12/2017 | Park | |
| 9,844,133 B2 | 12/2017 | Tomita | |
| 9,936,581 B1 | 4/2018 | Bergman et al. | |
| 10,117,328 B1 | 10/2018 | Zhong | |
| 10,154,583 B1 | 12/2018 | Glickman et al. | |
| 10,194,861 B2 | 2/2019 | Okumura | |
| 10,204,855 B2 | 2/2019 | Levander | |
| 10,310,560 B2 | 6/2019 | Choi | |
| 10,466,118 B1 | 11/2019 | Glickman et al. | |
| 10,535,845 B1 | 1/2020 | Liu et al. | |
| 2002/0018042 A1 * | 2/2002 | Albert | B41J 3/4076 345/107 |
| 2003/0227079 A1 * | 12/2003 | Chia | H01L 23/3114 257/723 |
| 2004/0094835 A1 | 5/2004 | Maghribi | |
| 2004/0243204 A1 | 12/2004 | Maghribi | |
| 2004/0256725 A1 * | 12/2004 | Inoue | H01L 21/76801 257/758 |
| 2005/0122700 A1 | 6/2005 | Kim | |
| 2006/0135863 A1 | 6/2006 | Birnbaum | |
| 2007/0096260 A1 * | 5/2007 | Eshun | H01L 23/5228 257/581 |
| 2007/0215883 A1 | 9/2007 | Dixon | |
| 2008/0018611 A1 | 1/2008 | Serban | |
| 2008/0044127 A1 | 2/2008 | Leising | |
| 2008/0093118 A1 * | 4/2008 | Takahashi | H05K 3/4691 174/264 |
| 2008/0099230 A1 * | 5/2008 | Takahashi | H05K 3/4691 174/250 |
| 2008/0139953 A1 | 6/2008 | Baker | |
| 2009/0108270 A1 * | 4/2009 | Chen | H01L 27/0248 257/88 |
| 2009/0229876 A1 * | 9/2009 | Takahashi | H05K 3/4691 174/378 |
| 2009/0257166 A1 * | 10/2009 | Kim | H01C 1/146 361/111 |
| 2009/0272197 A1 | 11/2009 | Ridao Granado | |
| 2009/0317639 A1 | 12/2009 | Axisa | |
| 2010/0014265 A1 * | 1/2010 | Sagisaka | H05K 3/4691 361/784 |
| 2010/0018634 A1 * | 1/2010 | Takahashi | H05K 3/4691 156/150 |
| 2010/0025087 A1 * | 2/2010 | Takahashi | H05K 3/4691 174/254 |
| 2010/0037497 A1 | 2/2010 | Anelevitz | |
| 2010/0063365 A1 | 3/2010 | Pisani | |
| 2010/0207770 A1 | 5/2010 | Serban | |
| 2010/0160762 A1 | 6/2010 | McLaughlin | |
| 2010/0185076 A1 | 7/2010 | Jeong | |
| 2011/0067904 A1 * | 3/2011 | Aoyama | H05K 3/4691 174/254 |
| 2011/0180306 A1 * | 7/2011 | Naganuma | H05K 1/115 174/254 |
| 2011/0180307 A1 * | 7/2011 | Naganuma | H05K 3/4691 174/254 |
| 2011/0194262 A1 * | 8/2011 | Naganuma | H05K 3/4691 361/749 |
| 2011/0198111 A1 * | 8/2011 | Naganuma | H05K 3/4691 174/254 |
| 2011/0199739 A1 * | 8/2011 | Naganuma | H05K 3/4691 361/749 |
| 2011/0203837 A1 * | 8/2011 | Naganuma | H05K 3/4691 174/254 |
| 2012/0052268 A1 | 3/2012 | Axisa | |
| 2012/0165633 A1 | 6/2012 | Khair | |
| 2012/0176764 A1 | 7/2012 | Loher | |
| 2012/0238910 A1 | 9/2012 | Nordstrom | |
| 2012/0325524 A1 * | 12/2012 | Naganuma | H05K 3/4691 174/254 |
| 2013/0019383 A1 | 1/2013 | Korkala | |
| 2013/0038545 A1 * | 2/2013 | Hsu | G06F 3/041 345/173 |
| 2013/0060115 A1 | 3/2013 | Gehman | |
| 2014/0124245 A1 | 5/2014 | Lai | |
| 2014/0190727 A1 | 7/2014 | Lee | |
| 2014/0209690 A1 | 7/2014 | Teng | |
| 2014/0343390 A1 | 11/2014 | Berzowska | |
| 2015/0065840 A1 | 3/2015 | Bailey | |
| 2015/0114689 A1 * | 4/2015 | Ishihara | H05K 3/4691 174/251 |
| 2015/0114690 A1 * | 4/2015 | Ishihara | H05K 3/4691 174/251 |
| 2015/0187863 A1 * | 7/2015 | Zhu | H01L 28/22 257/379 |
| 2015/0201856 A1 | 7/2015 | Stork | |
| 2015/0261057 A1 * | 9/2015 | Harris | G02B 26/026 359/271 |
| 2015/0366504 A1 | 12/2015 | Connor | |
| 2016/0161376 A1 | 6/2016 | Myry | |
| 2016/0165723 A1 | 6/2016 | Romero | |
| 2016/0183372 A1 | 6/2016 | Park | |
| 2016/0270727 A1 | 9/2016 | Berg | |
| 2017/0099729 A1 | 4/2017 | Kim et al. | |

(56) References Cited

U.S. PATENT DOCUMENTS

| | | | |
|---|---|---|---|
| 2017/0108459 A1* | 4/2017 | Katsuki | G01N 27/3272 |
| 2017/0150602 A1* | 5/2017 | Johnston | H05K 1/115 |
| 2017/0170799 A1 | 6/2017 | Kong et al. | |
| 2017/0172421 A1 | 6/2017 | Dabby | |
| 2017/0365644 A1 | 12/2017 | Zheng | |
| 2018/0020563 A1* | 1/2018 | Hong | H05K 1/0296 |
| 2018/0130713 A1* | 5/2018 | Cantoro | H01L 21/823412 |
| 2018/0249767 A1 | 9/2018 | Begriche | |

OTHER PUBLICATIONS

Final office action dated Feb. 19, 2019, U.S. Appl. No. 15/874,649, filed Jan. 18, 2018, applicant: Michael James Glickman, 25 pages.
Non-Final Office Action dated Mar. 22, 2019, U.S. Appl. No: 15/249,024, filed Aug. 26, 2016,applicant: Michael James Glickman, dated: Mar. 22, 2019, 22 pages.
Final office action dated Mar. 29, 2019, U.S. Appl. No. 14/724,673, filed May 28, 2015, Applicant: Weifeng Liu, 27 p[ages.
Non-Final Office Action, U.S. Appl. No. 16/016,138, filed: Jun. 22, 2018, Applicant: Mark Bergman, dated Dec. 23, 2019, 19 pages.
Kwang-Seok Kim, Design and fabrication of Screen-Printed Silver Circuits for Stretchable Electronics, Jul. 13, 2013 (Year 2013).
Non Final Office Action dated Dec. 9, 2019, U.S. Appl. No. 14/724,673, field May 28, 2015, applicant: Weifeng Liu, 17 pages.

\* cited by examiner

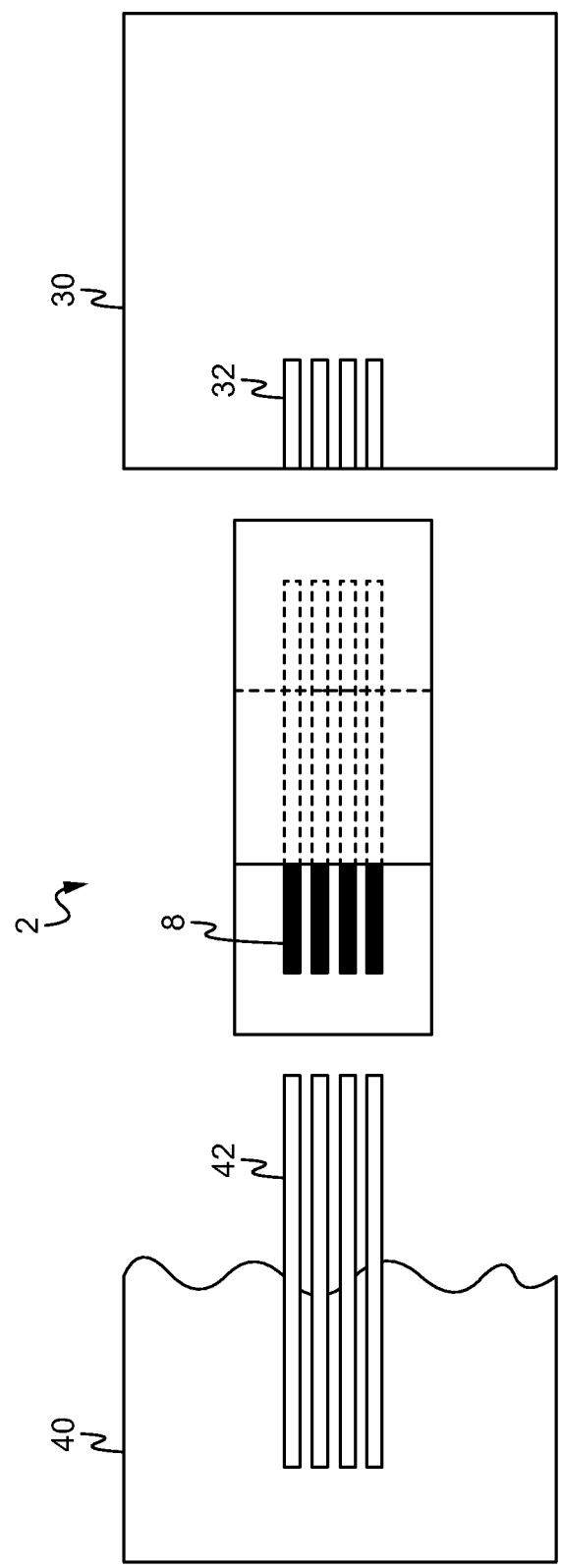

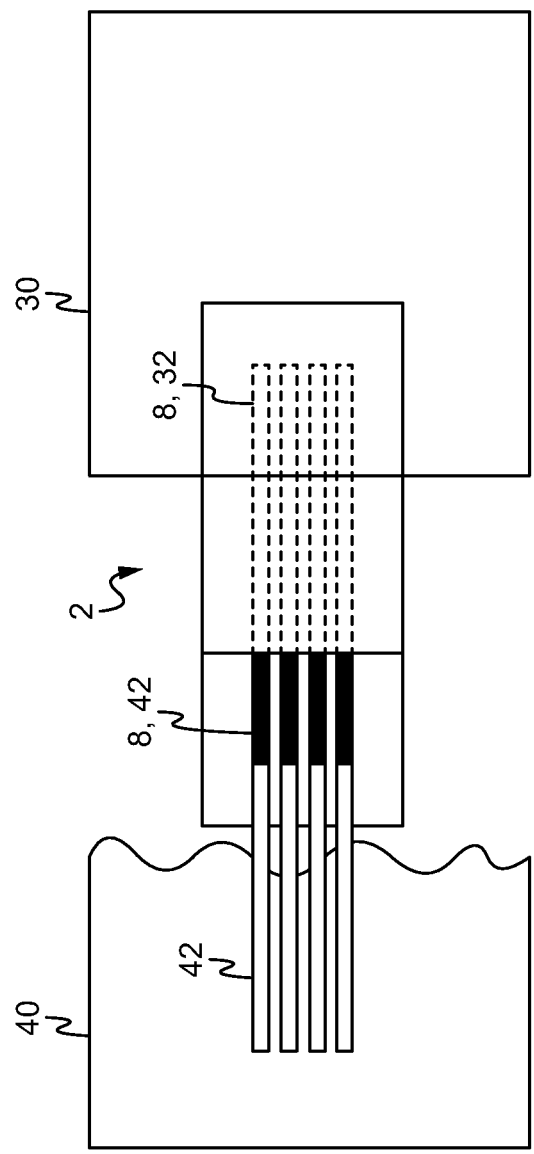

MICRO CONDUCTIVE THREAD INTERCONNECT COMPONENT TO MAKE AN INTERCONNECT BETWEEN CONDUCTIVE THREADS IN FABRICS TO PCB, FPC, AND RIGID-FLEX CIRCUITS

RELATED APPLICATIONS

This Patent Application claims priority under 35 U.S.C. 119 (e) of the U.S. Provisional Application, Ser. No. 62/466,270, filed Mar. 2, 2017, and entitled "MICRO CONDUCTIVE THREAD INTERCONNECT COMPONENT TO MAKE AN INTERCONNECT BETWEEN CONDUCTIVE THREADS IN FABRICS TO PCB, FPC, AND RIGID-FLEX CIRCUITS". This application incorporates U.S. Provisional Application, Ser. No. 62/466,270 in its entirety by reference.

FIELD OF THE INVENTION

The present invention is generally directed to the field of electronic interconnect components. More specifically, the present invention is directed to a micro conductive thread interconnect component used to make an interconnect between conductive threads in fabrics and a circuit board.

BACKGROUND OF THE INVENTION

Electronic devices are increasingly being developed so as to be worn by a user, such as in wearable electronics. Metal wires are commonly used as electrical conductors between electronic devices. As applied to wearable electronics, providing electrical connectivity to or between one or more worn electrical devices is typically done using a separate electrical cable that includes a metal wire. However, having loose cables is often a nuisance and ungainly.

Conductive threads are increasingly being incorporated into fabrics and electronic components are attached to these conductive threads. However, textile manufactures are typically ill-equipped and inexperienced where it comes to electronic devices, and electronic interconnects in particular. As such, attachment of an electronic device to conductive threads woven into the fabric by textile manufactures often results in poor workmanship and low yields.

SUMMARY OF THE INVENTION

Embodiments are directed to an interconnect component configured for mechanical and electrical interconnects between conductive threads, such as those woven within fabrics, and electrical connection points, such as contact pads on a printed circuit board (PCB), a flexible printed circuit (FPC), and/or a rigid-flex circuit board, collectively referred to as circuit boards.

In an aspect, an interconnect component is disclosed. The interconnect component comprises a dielectric layer and one or more conductors embedded within the dielectric layer. Each conductor has a first end and a second end, and the dielectric layer has a first opening and a second opening. The first end of each of the one or more conductors is exposed within the first opening, and the second end of each of the one or more conductors is exposed within the second opening. In some embodiments, the interconnect component is a dual access interconnect component, the first opening is a first access opening to the first ends of the one or more conductors and the second opening is a second access opening to the second ends of the one or more conductors for physical and electrical connection external to the dual access interconnect component, wherein a remaining portion of each of the one or more conductors is completely embedded within the dielectric layer. In some embodiments, the dielectric layer has a first surface and a second surface opposite the first surface, wherein the first opening is formed at the first surface and the second opening is formed at the second surface. In some embodiments, the first opening is formed at a first distal end of the interconnect component, and the second opening is formed at a second distal end of the interconnect component. In other embodiments, the dielectric layer has a first surface and a second surface opposite the first surface, further wherein the first opening and the second opening are both formed at the first surface, and the first opening is formed at a first distal end of the interconnect component, and the second opening is formed at a second distal end of the interconnect component. In some embodiments, the dielectric layer and the second dielectric layer are made of a rigid material. In other embodiments, the dielectric layer and the second dielectric layer are made of a flexible material. In some embodiments, each of the one or more conductors is made of a metal wire. In some embodiments, each of the one or more conductors is made of a conductive ink. In some embodiments, each of the one or more conductors is a pattern etched metal substrate. In some embodiments, the dielectric layer comprises a first dielectric layer and a second dielectric layer, wherein the one or more conductors are sandwiched between the first dielectric layer and the second dielectric layer.

In another aspect, an interconnect assembly is disclosed. The interconnect assembly comprises a fabric, an interconnect component, and a circuit board. The fabric has one or more conductive threads. The interconnect component comprises a dielectric layer and one or more conductors embedded within the dielectric layer. Each conductor has a first end and a second end, and the dielectric layer has a first opening and a second opening. The first end of each of the one or more conductors is exposed within the first opening and is connected to a corresponding one of the one or more conductive threads, and the second end of each of the one or more conductors is exposed within the second opening. The circuit board has one or more connection points. Each second end of the one or more conductors is connected to a corresponding one of the one or more connection points of the circuit board.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 2 illustrates a top down view of disassembled elements including the interconnect component of FIG. 1, a fabric, and a circuit board according to an embodiment.

FIG. 3 illustrates an assembly of the interconnect component with the circuit board and the fabric of FIG. 2.

DETAILED DESCRIPTION OF THE EMBODIMENTS

Figure 1A:
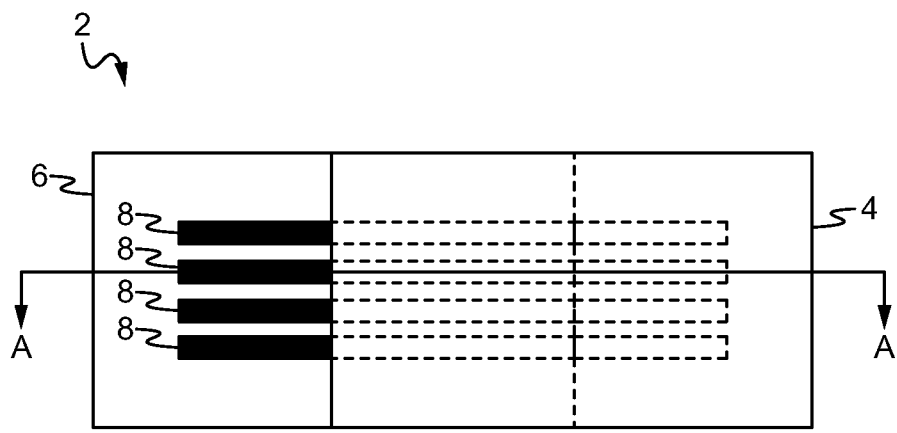
FIG. 1A illustrates a top down view of an interconnect component according to an embodiment.

Embodiments of the present application are directed to an interconnect component for coupling conductive threads in a fabric to an electronic device such as a circuit board. Those of ordinary skill in the art will realize that the following detailed description of the interconnect component are illustrative only and is not intended to be in any way limiting. Other embodiments of the interconnect component will readily suggest themselves to such skilled persons having the benefit of this disclosure.

Reference will now be made in detail to implementations of the interconnect component as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the term "fabric" generally applies to cloth, textile, or other similar materials made of threads, fibers, filaments or the like, generally referred to herein as "threads". Materials used for threads can include, but are not limited to, cotton, wool, nylon, polyester or other synthetic materials. Conductive threads woven into a fabric can be any type of electrically conductive material capable of being woven into a fabric. In some embodiments, the conductive thread is a thread, filament, or wire made of electrically conductive material such as metal, carbon fiber, nylon wire coated with silver finish, or metal particles embedded polymer wire. Examples of metal wire include, but are not limited to, copper, silver, steel or their alloys. The metal wire can also be coated with different finishes such as gold flash over nickel, silver or solder. It is understood that alternative electrically conductive materials can be used for the conductive thread.

As used herein, the term "woven" generally refers to intermixing or blending together and is applied herein to describe the manner by which an electrically conductive thread is integrated as part of a fabric. The electrically conductive thread is intermixed with the fabric using conventional methodologies, for example weaving, stitching, felting or knitting, and is intended to include, but not be limited to, such similar concepts as intertwining, interweaving, interspersing, interlacing, intermingling and the like of the electrically conductive threads and fabric threads. Although the following description refers to "weaving" the electrically conductive wire onto the fabric, it is intended that such description is intended to refer to the general concept of intermixing the conductive threads and the fabric threads.

Embodiments are directed to an interconnect component configured for mechanical and electrical interconnects between conductive threads, such as those woven within fabrics, and electrical connection points, such as contact pads on a printed circuit board (PCB), a flexible printed circuit (FPC), and/or a rigid-flex circuit board, collectively referred to as circuit boards. The interconnect component can be formed as one or more conductors insulated between one or more dielectric material layers (e.g., layers having the same material composition, or layers having differing material compositions) with access openings through the dielectric layer(s) to the conductors both from a first surface (top) and a second surface (bottom) of the interconnect component. The interconnect component can be manufactured using polymers that can be formed by one or more of: injection molding, extruding, lamination in sheet form, or roll to roll processing with the conductors in the center of the dielectrics. In some embodiments, the top and bottom access openings are mechanically generated using machine and or laser milling.

According to some embodiments, the interconnect component is coupled with a circuit board during SMT (Surface Mount Technology) assembly when the balance of the electrical components are being mounted to the circuit board. The exposed portions of the conductors of the interconnect component can be attached to corresponding contact pads on the circuit board using conventional attachment means including, but not limited to, solder, laser weld, or conductive adhesive. Each conductive thread in the fabric is positioned on a corresponding one of the conductors of the interconnect component and attached using conventional attachment means including, but not limited to, solder, laser weld, or conductive adhesive. In this manner, the interconnect component functions as an adapter or interposer that provides an interconnect transition from the conductive threads to connection points on the circuit board.

Figure 1B:
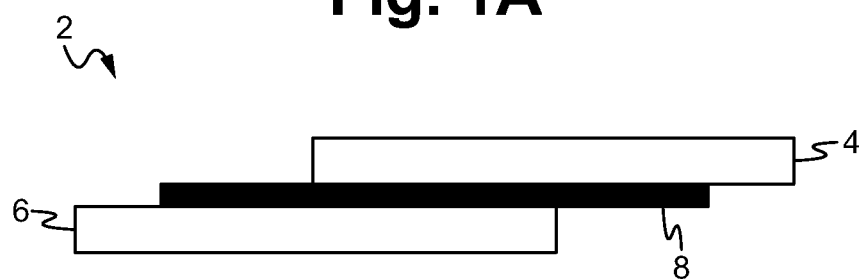
FIG. 1B illustrates a cut out side view of the interconnect component along the line AA shown in FIG. 1A.
Figure 1C:
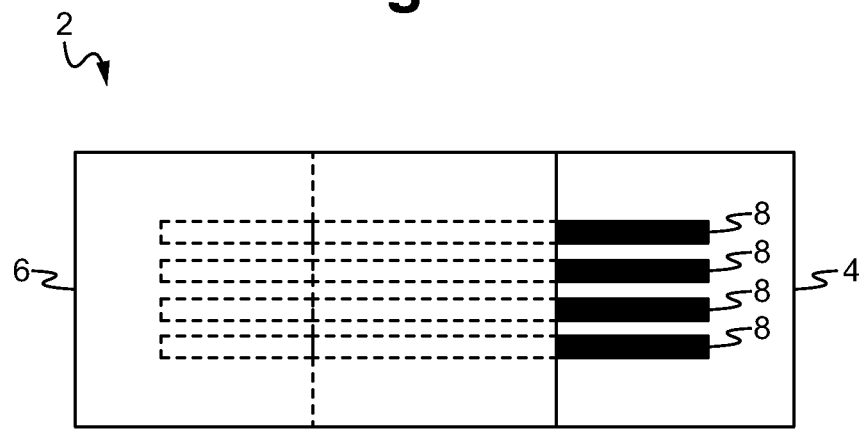
FIG. 1C illustrates a bottom up view of the interconnect component of FIG. 1A.

FIG. 1A illustrates a top down view of an interconnect component 2 according to an embodiment. FIG. 1B illustrates a cut out side view of the interconnect component 2 along the line AA shown in FIG. 1A. FIG. 1C illustrates a bottom up view of the interconnect component 2 of FIG. 1A. The interconnect component 2 includes one or more conductors 8 sandwiched between a dielectric layer 4 and a dielectric layer 6. Although the figures show four conductors 8, it is understood that the interconnect component can include more or less than four conductors. Each of the conductors 8 is physically and electrically isolated from each other so as to provide an independent signaling path. Each conductor 8 has a first end and a second end. The first end of each conductor 8 is exposed from the dielectric layer 4, as shown in FIGS. 1A and 1B, and the second end of each conductor 8 is exposed from the dielectric layer 6, as shown in FIGS. 1B and 1C. The remaining portion of each conductor 8 is embedded, and completely enclosed within the dielectric layers 4, 6. In other words, the dielectric layer 4 has an access opening at which the first ends of the conductors 8 are exposed, and the dielectric layer 6 has an access opening at which the second ends of the conductors 8 are exposed. In this manner, the interconnect component 2 is a dual access circuit having a first access from a first surface (top surface as shown in FIG. 1A) and a second access from a second surface (bottom surface as shown in FIG. 1C). In some embodiments, the conductors 8 are preformed, such as rolled flat copper wires, prior to being assembled between the dielectric layers 4, 6. In other embodiments, the conductors 8 are conductive ink printed onto an exposed surface of one of the dielectric layers.

Subsequent fabrication steps result in the exposed first and second ends of the conductors. In still other embodiments, the conductors 8 are conductive traces formed from metal foils or deposited metal by conventional pattern etching techniques, with subsequent fabrication steps resulting in the exposed first and second ends of the conductors.

The dielectric layers 4, 6 can be formed from rigid or flexible materials including, but not limited to, various types of polymers such as polyethylene terephthalate (PET), thermoplastic polyurethane (TPU), liquid crystal polymer (LCP), or polyimide. It is understood that other conventional insulating materials can be used as the dielectric layers 4, 6.

The first ends of the conductors 8 are sufficiently exposed to enable connection with a corresponding conductive thread, such as a conductive thread woven into a fabric. The second ends of the conductors 8 are sufficiently exposed to enable connection with a corresponding connection point, such as a contact pad on a circuit board. FIG. 2 illustrates a top down view of disassembled elements including the interconnect component 2, a fabric 40, and a circuit board 30 according to an embodiment. The circuit board 30 includes connection points 32, such as contact pads. The fabric 40 includes conductive threads 42, the ends of which are exposed. FIG. 3 illustrates an assembly of the interconnect component 2 with the circuit board 30 and the fabric 40. The first ends of the conductors 8 are attached to the ends of the conductive threads 42, and the second ends of the conductors 8 are attached to the connection points 32 of the circuit board 30.

The connection between the first end of each conductor 8 and a corresponding conductive thread forms an electrical connection, and the physical connection therebetween can be either direct, such as by laser welding, or indirect via a conductive material, such as solder or conductive adhesive. The connection between the second end of each conductor 8 and a corresponding connection point forms an electrical connection, and the physical connection therebetween can be either direct, such as by laser welding, or indirect via a conductive material, such as solder or conductive adhesive. There is a one-to-one relationship between the number of conductive threads and the number of connection points attached to the interconnect component 2.

As shown in FIGS. 1A-1C, the conductor line width, spacing, and pitch is consistent from the first end of each conductor 8 to the second end. The line width, spacing, and/or pitch can be configured at the first end to match the corresponding position and size of the conductive threads to be attached to the first ends. Similarly, the line width, spacing, and/or pitch can be configured at the second end to match the corresponding position, size, spacing, and/or pitch of the connection points to be attached to the second ends. In some embodiments, the positions and dimensions of the conductive threads match those of the connection points, and as such, line width, spacing, and pitch is consistent from the first end of each conductor 8 to the second end, as shown in FIGS. 1A-1C. In other embodiments, the positions and dimensions of the conductive threads are different than those of the connection points, and as such, line width, spacing, and pitch at the first ends of the conductors are not the same as the line width, spacing, and pitch at the second ends of the conductors. In this manner, the interconnect component can function to "fan out" or "fan in" connections made at the first and second ends of the conductors.

Figure 4A:
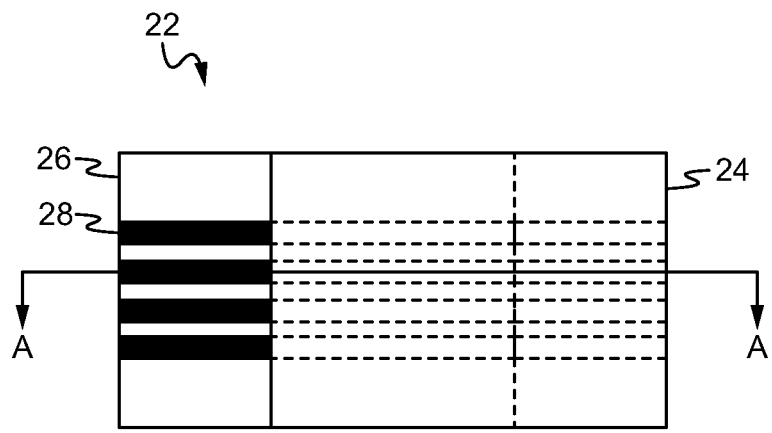
FIG. 4A illustrates a top down view of an interconnect component according to another embodiment.
Figure 4B:
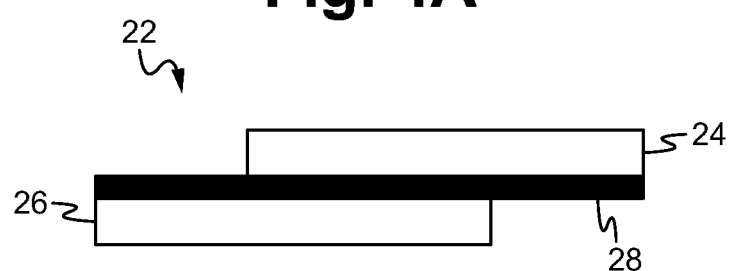
FIG. 4B illustrates a cut out side view of the interconnect component along the line AA shown in FIG. 4A.
Figure 4C:
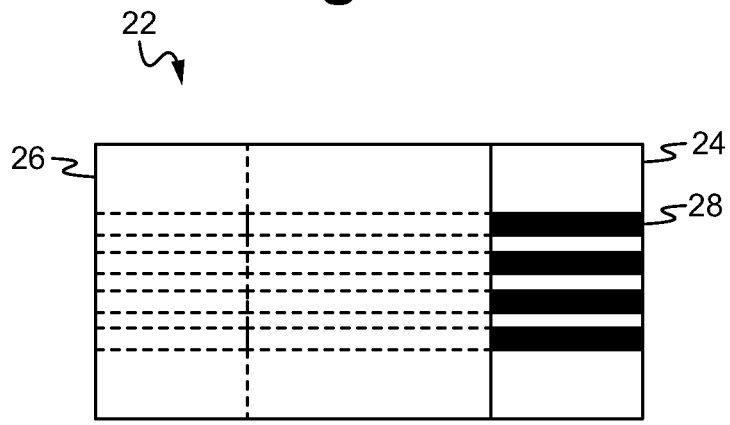
FIG. 4C illustrates a bottom up view of the interconnect component of FIG. 4A.

FIGS. 1A-1C show the distal first end of each conductor 8 as terminating prior to the edge of the dielectric layer 6 and the distal second end of each conductor 8 as terminating prior to the edge of the dielectric layer 4. Alternatively, the distal first ends and distal second ends of the conductors can extend to the edges of the dielectric layers. FIG. 4A illustrates a top down view of an interconnect component 22 according to another embodiment. FIG. 4B illustrates a cut out side view of the interconnect component 22 along the line AA shown in FIG. 4A. FIG. 4C illustrates a bottom up view of the interconnect component 22 of FIG. 4A. The interconnect component 22 includes one or more conductors 28 sandwiched between a dielectric layer 24 and a dielectric layer 26. The interconnect component 22 is configured and functions similarly as the interconnect component 2 of FIGS. 1A-1C except that the conductors 28 extend to the edges of the dielectric layers. Specifically, first ends of the conductors 28 extend to the edge of the dielectric layer 26, as shown in FIGS. 4A-4B, and second ends of the conductors 28 extend to the edge of the dielectric layer 24, as shown in FIGS. 4B-4C.

Although embodiments of the interconnect component are shown and described as having the first ends of the conductors exposed on a first surface and the second ends of the conductors exposed on a second surface, it is understood that the first ends and the second ends can both be exposed on the same surface, for example both first ends and second ends are exposed on the top surface of the interconnect component.

The present application has been described in terms of specific embodiments incorporating details to facilitate the understanding of the principles of construction and operation of the interconnect component. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An interconnect component comprising:
    a. a dielectric layer; and
    b. a plurality of conductors embedded within the dielectric layer, the plurality of conductors constitute all conductors in the interconnect component, wherein each of the plurality of conductors are electrically isolated from each other and all of the plurality of conductors are positioned in a same longitudinal plane of the interconnect component and without interconnecting vias, further wherein each conductor has a first end and a second end, and the dielectric layer has a first opening and a second opening, further wherein the first end of each of the plurality of conductors is exposed within the first opening, and the second end of each of the plurality of conductors is exposed within the second opening.

2. The interconnect component of claim 1 wherein the interconnect component is a dual access interconnect component, the first opening is a first access opening to the first ends of the plurality of conductors and the second opening is a second access opening to the second ends of the plurality of conductors for physical and electrical connection external to the dual access interconnect component, further wherein a remaining portion of each of the plurality of conductors is completely embedded within the dielectric layer.

3. The interconnect component of claim 1 wherein the dielectric layer has a first surface and a second surface opposite the first surface, further wherein the first opening is formed at the first surface and the second opening is formed at the second surface.

4. The interconnect component of claim 3 wherein the first opening is formed at a first distal end of the interconnect component, and the second opening is formed at a second distal end of the interconnect component.

5. The interconnect component of claim 1 wherein the dielectric layer has a first surface and a second surface opposite the first surface, further wherein the first opening and the second opening are both formed at the first surface.

6. The interconnect component of claim 5 wherein the first opening is formed at a first distal end of the interconnect component, and the second opening is formed at a second distal end of the interconnect component.

7. The interconnect component of claim 1 wherein the dielectric layer is made of a rigid material.

8. The interconnect component of claim 1 wherein the dielectric layer is made of a flexible material.

9. The interconnect component of claim 1 wherein each of the plurality of conductors is made of a metal wire.

10. The interconnect component of claim 1 wherein each of the plurality of conductors is made of a conductive ink.

11. The interconnect component of claim 1 wherein each of the plurality of conductors is a pattern etched metal substrate.

12. The interconnect component of claim 1 wherein the dielectric layer comprises a first dielectric layer and a second dielectric layer, further wherein the plurality of conductors are sandwiched between the first dielectric layer and the second dielectric layer.

13. The interconnect component of claim 1 wherein all conductors in the interconnect component are positioned in the same longitudinal plane of the interconnect component.

14. The interconnect component of claim 1 wherein the dielectric layer is in direct physical contact with all conductors in the interconnect component, further wherein the dielectric layer has a first surface and a second surface opposite the first surface, the first surface and the second surface are each completely exposed, wherein the first surface of the dielectric layer and the second surface of the dielectric layer are parallel to a longitudinal axis of the interconnect component.

15. An interconnect assembly comprising:
  a. a fabric having plurality of conductive threads;
  b. an interconnect component comprising
    i. a dielectric layer; and
    ii. a plurality of conductors embedded within the dielectric layer, the plurality of conductors constitute all conductors in the interconnect component, wherein each of the plurality of conductors are electrically isolated from each other and all of the plurality of conductors are positioned in a same longitudinal plane of the interconnect component and without interconnecting vias, further wherein each conductor has a first end and a second end, and the dielectric layer has a first opening and a second opening, further wherein the first end of each of the plurality of conductors is exposed within the first opening, and the second end of each of the plurality of conductors is exposed within the second opening; and
  c. a circuit board having a plurality of connection points, wherein each second end of the plurality of conductors is connected to a corresponding one of the plurality of connection points of the circuit board.

16. The interconnect assembly of claim 15 wherein the interconnect component is a dual access interconnect component, the first opening is a first access opening to the first ends of the plurality of conductors for physical and electrical connection to the plurality of conductive threads of the fabric, and the second opening is a second access opening to the second ends of the plurality of conductors for physical and electrical connection to the plurality of connection points of the circuit board, further wherein a remaining portion of each of the plurality of conductors is completely embedded within the dielectric layer.

17. The interconnect assembly of claim 15 wherein the dielectric layer has a first surface and a second surface opposite the first surface, further wherein the first opening is formed at the first surface and the second opening is formed at the second surface.

18. The interconnect assembly of claim 17 wherein the first opening is formed at a first distal end of the interconnect component, and the second opening is formed at a second distal end of the interconnect component.

19. The interconnect assembly of claim 15 wherein the dielectric layer has a first surface and a second surface opposite the first surface, further wherein the first opening and the second opening are both formed at the first surface.

20. The interconnect assembly of claim 19 wherein the first opening is formed at a first distal end of the interconnect component, and the second opening is formed at a second distal end of the interconnect component.

21. The interconnect assembly of claim 15 wherein the dielectric layer is made of a rigid material.

22. The interconnect assembly of claim 15 wherein the dielectric layer is made of a flexible material.

23. The interconnect assembly of claim 15 wherein each of the plurality of conductors is made of a metal wire.

24. The interconnect assembly of claim 15 wherein each of the plurality of conductors is made of a conductive ink.

25. The interconnect assembly of claim 15 wherein each of the plurality of conductors is a pattern etched metal substrate.

26. The interconnect assembly of claim 15 wherein the dielectric layer comprises a first dielectric layer and a second dielectric layer, further wherein the plurality of conductors are sandwiched between the first dielectric layer and the second dielectric layer.

27. An interconnect component comprising:
  a. a dielectric layer; and
  b. a plurality of conductors embedded within the dielectric layer, wherein each of the plurality of conductors are electrically isolated from each other and all of the plurality of conductors are positioned in a same longitudinal plane of the interconnect component, further wherein each conductor has a first end and a second end, each conductor having a uniform thickness and a solid inner layer, and the dielectric layer has a first opening and a second opening, wherein the dielectric layer further has a first surface and a second surface opposite the first surface, further wherein the first opening is formed at the first surface and the second opening is formed at the second surface, further wherein the first end of each of the plurality of conductors is exposed within the first opening, and the second end of each of the plurality of conductors is exposed within the second opening.

28. The interconnect component of claim 27 wherein the first opening is formed at a first distal end of the interconnect component, and the second opening is formed at a second distal end of the interconnect component.

29. An interconnect component comprising:
a. a dielectric layer; and
b. a plurality of conductors embedded within the dielectric layer, wherein each of the plurality of conductors are electrically isolated from each other and all of the plurality of conductors are positioned in a same longitudinal plane of the interconnect component, further wherein each conductor has a first end and a second end, each conductor having a uniform thickness and a solid inner layer, and the dielectric layer has a first opening and a second opening, further wherein the first end of each of the plurality of conductors is exposed within the first opening, and the second end of each of the plurality of conductors is exposed within the second opening, wherein the dielectric layer is in direct physical contact with all conductors in the interconnect component, further wherein the dielectric layer has a first surface and a second surface opposite the first surface, the first surface and the second surface are each completely exposed, wherein the first surface of the dielectric layer and the second surface of the dielectric layer are parallel to a longitudinal axis of the interconnect component.

* * * * *